United States Patent
Cheng et al.

(10) Patent No.: US 9,496,343 B2
(45) Date of Patent: Nov. 15, 2016

(54) SECONDARY USE OF ASPECT RATIO TRAPPING HOLES AS EDRAM STRUCTURE

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/004,079

(22) Filed: Jan. 22, 2016

(65) Prior Publication Data

US 2016/0155805 A1    Jun. 2, 2016

Related U.S. Application Data (62) Division of application No. 14/501,366, filed on Sep. 30, 2014, now Pat. No. 9,263,453.

(51) Int. Cl.
| | |
|---|---|
| *H01L 29/10* | (2006.01) |
| *H01L 29/78* | (2006.01) |
| *H01L 27/108* | (2006.01) |
| *H01L 29/20* | (2006.01) |

(52) U.S. Cl.
CPC ......... *H01L 29/1054* (2013.01); *H01L 27/108* (2013.01); *H01L 27/1082* (2013.01); *H01L 27/1087* (2013.01); *H01L 27/10826* (2013.01); *H01L 27/10829* (2013.01); *H01L 27/10832* (2013.01); *H01L 27/10858* (2013.01); *H01L 27/10867* (2013.01); *H01L 27/10879* (2013.01); *H01L 29/20* (2013.01); *H01L 29/78* (2013.01); *H01L 27/10894* (2013.01)

(58) Field of Classification Search
CPC . H01L 28/60; H01L 21/84; H01L 27/10829; H01L 27/1203; H01L 27/1087; H01L 29/66181
USPC .......................................... 257/301; 438/389
See application file for complete search history.

(56) References Cited

U.S. PATENT DOCUMENTS

| | | |
|---|---|---|
| 7,525,164 B2 | 4/2009 | Forbes |
| 8,120,094 B2 | 2/2012 | Liaw et al. |
| 8,445,341 B2 | 5/2013 | Matsushita |
| 8,455,929 B2 | 6/2013 | Ko et al. |
| 8,592,864 B2 | 11/2013 | Wang et al. |

(Continued)

*Primary Examiner* — Thomas L Dickey
*Assistant Examiner* — Changhyun Yi
(74) *Attorney, Agent, or Firm* — Scully, Scott, Murphy & Presser, P.C.; Daniel P. Morris, Esq.

(57) ABSTRACT

A semiconductor structure is provided according to a method in which an aspect ratio trapping process is employed. The structure includes a semiconductor substrate comprising a first semiconductor material having a first lattice constant. A first layer of second semiconductor material formed on the substrate, the first layer having a second lattice constant that is greater than the first lattice constant. A second layer of a semi-insulating, third semiconductor material is formed atop a top surface of the first layer. A transistor device is formed on top of the second layer. An eDRAM structure is connected electronically with a channel region of the transistor device, the eDRAM structure extending from the channel region of the transistor device to a sub-surface below a top surface of the semiconductor substrate.

11 Claims, 6 Drawing Sheets

(56) References Cited

U.S. PATENT DOCUMENTS

| | | |
|---|---|---|
| 2009/0108314 A1 | 4/2009 | Cai et al. |
| 2011/0169065 A1* | 7/2011 | Cheng ................... H01L 21/84 257/301 |
| 2013/0099283 A1 | 4/2013 | Lin et al. |
| 2013/0292777 A1 | 11/2013 | Liaw |
| 2014/0070292 A1 | 3/2014 | Cheng et al. |
| 2014/0252368 A1* | 9/2014 | Lee ................... H01L 29/66462 257/76 |

* cited by examiner

SECONDARY USE OF ASPECT RATIO TRAPPING HOLES AS EDRAM STRUCTURE

BACKGROUND

The present application relates to a semiconductor structure and a method of forming the same. More particularly, the present application relates to a method of providing an eDRAM (embedded dynamic random access memory) device using holes formed by using aspect ratio trapping structures (ART).

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

III-V CMOS is one high performance option for future technology nodes. III-V circuits need eDRAM as silicon CMOS does. Co-integration of III-V with silicon is very challenging due to the high lattice mismatch of III-V semiconductors and silicon. Aspect ratio trapping (ART) is one way to overcome the lattice mismatch, however ART requires trenches or pillars with dielectric, i.e., oxide or nitride sidewalls, to grow the III-V epitaxy. Those dielectric regions consume area, which is contrary to the shrinking requirements of future smaller device nodes.

SUMMARY

A semiconductor eDRAM structure and method of forming an eDRAM structure is disclosed.

In one aspect, an array of eDRAM structures using oxide trenches or pillars and a method of fabricating is disclosed.

In the methods, a use is made of aspect ratio trapping holes as EDRAM trenches/holes.

In one aspect of the present application, a method of forming a semiconductor structure is provided. In one embodiment of the present application, the method includes forming a plurality of sacrificial circular-shaped insulating pillar structures above a semiconductor substrate, the semiconductor substrate comprising a first semiconductor material having a first lattice constant. Then there is formed a second layer of a second semiconductor material above the substrate to surround and extend above top surfaces of the insulating pillar structures, the second semiconductor material having a second lattice constant that is greater than the first lattice constant. Then, there is formed a third layer of semi-insulating, semiconductor layer of a third semiconductor material atop a surface of the second layer. Then, the method includes forming a plurality of transistor devices above the third layer, each respective formed transistor device including a channel region having a portion in alignment with a top surface of a corresponding underlying insulating pillar structure of the plurality. The method then includes forming a hole structure extending from a corresponding channel region of each transistor and through the third layer to expose a top surface of a corresponding underlying insulating pillar structure. Then, through each the formed hole structure, the method includes removing each corresponding sacrificial insulating pillar structure. Then, an eDRAM device structure is formed in each the corresponding removed sacrificial insulating pillar structure.

In another aspect of the present application, a semiconductor structure is provided. In accordance with an embodiment of the present application, the semiconductor structure includes a semiconductor substrate comprising a first semiconductor material having a first lattice constant. A first layer of second semiconductor material formed on the substrate, the first layer having a second lattice constant that is greater than the first lattice constant. A second layer of a semi-insulating, third semiconductor material is atop a top surface of the first layer. A transistor device is formed on top of the second layer. An eDRAM structure electronically connected with an active device region of the transistor device extends from the channel region of the transistor device to a subsurface below a top surface of the semiconductor substrate.

DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As mentioned above, co-integration of semiconductor materials having different lattice constants is one challenging aspect of forming high performance devices of future technology nodes. Aspect ratio trapping (ART) is one way to overcome the lattice mismatch. In ART, the aspect ratio trapping typically works better when the aspect ratio (trench depth to trench width) of the trench is at least 1:2, but in the embodiments described herein, may be 1:10 to 1:100 or higher. However, ART requires trenches with dielectric sidewalls to epitaxial grow a lattice mismatched semiconductor material from a base semiconductor substrate. The dielectric regions that are used during ART consume area, which is contrary to the shrinking requirements of future smaller device nodes. The present application provides a method that overcomes the above problems with conventional ART, and uses the ART structure(s) provided to form eDRAM structure(s).

Figure 1:
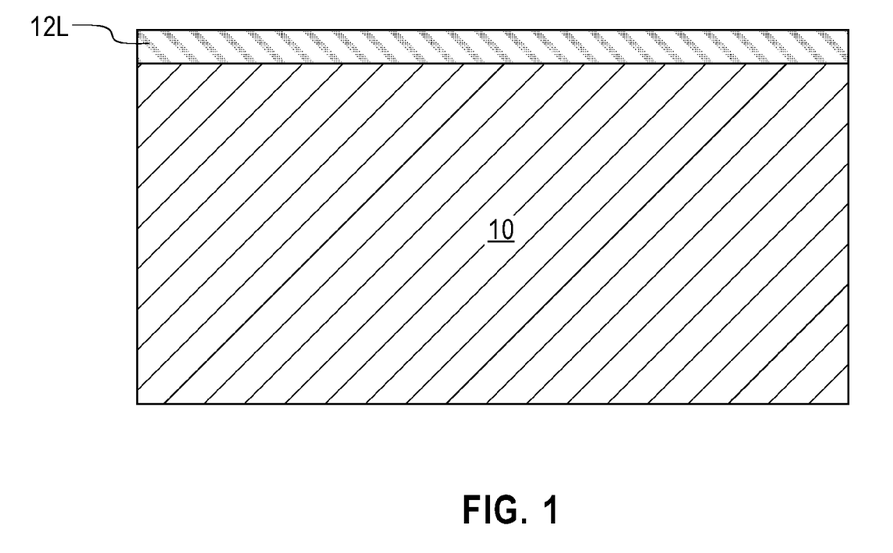
FIG. 1 is a cross sectional view of an exemplary semiconductor structure comprising a hard mask layer located on an exposed topmost surface of a semiconductor substrate comprising a first semiconductor material having a first lattice constant that can be employed in accordance with an embodiment of the present application.

Referring first to FIG. 1, there is illustrated an exemplary semiconductor structure comprising a hard mask layer 12L located on an exposed topmost surface of a semiconductor substrate 10 that can be employed in accordance with an embodiment of the present application. The semiconductor substrate 10 that can be employed in the present application is a bulk semiconductor substrate that comprises a first semiconductor material having a first lattice constant.

The term "bulk" as used in conjunction with the phrase "semiconductor substrate" denotes that the semiconductor substrate 10 is comprised entirely of the first semiconductor material. The first semiconductor material the provides the semiconductor substrate 10 may include but is not limited to, Si, Ge, SiGe, SiC, SiGeC, and III/V compound semiconductors such as, for example, InAs, GaAs, and InP. The semiconductor substrate 10 may be a single crystalline semiconductor material, a polycrystalline semiconductor material or an amorphous semiconductor material. In one embodiment of the present application, the semiconductor substrate 10 is comprised of single crystalline silicon. The crystal orientation of the semiconductor substrate 10 may be {100}, {110}, or {111}. Other crystallographic orientations besides those specifically mentioned can also be used in the present application.

The hard mask layer 12L that is present on the exposed topmost surface of the semiconductor substrate 10 is a contiguous layer that covers the entirety of the topmost surface of the semiconductor substrate 10. The hard mask layer 12L that is employed in the present application may include a semiconductor oxide, a semiconductor nitride and/or a semiconductor oxynitride. In one embodiment, the hard mask material that can be used in providing the hard mask layer 12L can be comprised of silicon dioxide. In another embodiment, the hard mask material that can be used in providing the hard mask layer 12L can be comprised of silicon nitride. In yet another embodiment, the hard mask material that can be used in providing the hard mask layer 12L can be a stack comprised of, in any order, silicon dioxide and silicon nitride.

In some embodiments, the hard mask material that can be used in providing the hard mask layer 12L can be formed by a deposition process such as, for example, chemical vapor deposition (CVD) or plasma enhanced chemical vapor deposition (PECVD). In other embodiments, the hard mask material that can be used in providing the hard mask layer 12L can be formed by a thermal process such as, for example, thermal oxidation and/or thermal nitridation. In yet other embodiments, the hard mask material that can be used in providing the hard mask layer 12L can be formed by a combination of a deposition process and a thermal process. The thickness of the hard mask material that can be used in providing the hard mask layer 12L can range from 2 nm to 10 nm, with a thickness from 3 nm to 6 nm being more typical.

Figure 2:
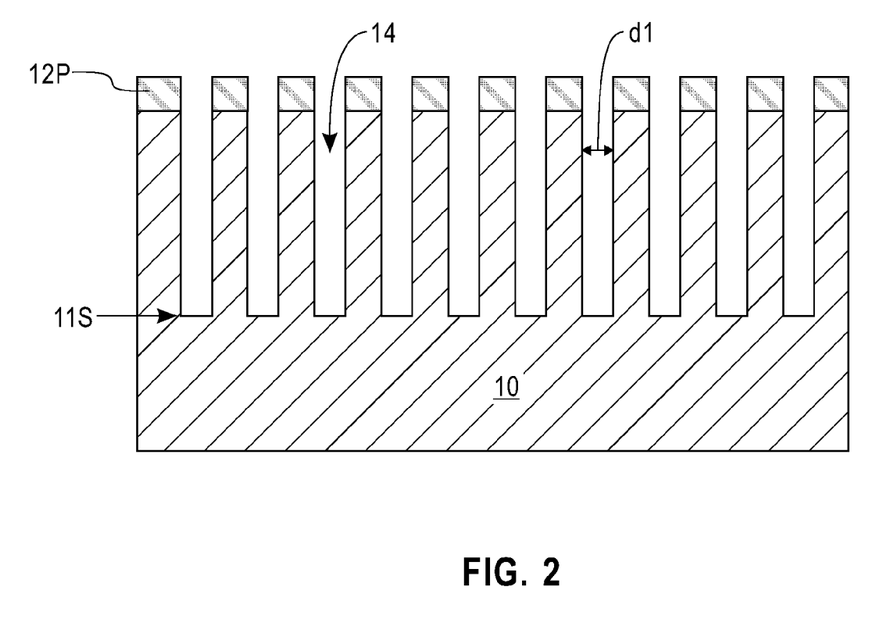
FIG. 2 is a cross sectional view of the exemplary semiconductor structure of FIG. 1 after patterning the hard mask layer and the semiconductor substrate to provide a plurality of first holes located within the semiconductor substrate.

Referring now to FIG. 2, there is illustrated the exemplary semiconductor structure of FIG. 1 after patterning the hard mask layer 12L and the semiconductor substrate 10 to provide a plurality of first circular-shaped holes 14 located within the semiconductor substrate 10. The remaining portions of the hard mask layer 12L can now be referred herein as a hard mask portion 12P.

The plurality of first holes 14 can be formed by patterning the hard mask layer 12L and the semiconductor substrate 10. Each first hole of the plurality of first holes 14 that is formed extends completely through the hard mask layer 12L but only partially into the semiconductor substrate 10. Thus, a bottommost surface of each first hole of the plurality of first holes 14 exposes a sub-surface 11S of the semiconductor substrate. By "sub-surface" it is meant a surface of the original semiconductor substrate 10 that is located beneath the topmost surface of the semiconductor substrate 10. In one embodiment of the present application, the sub-surface 11S below the original topmost surface of the semiconductor substrate 10 that is exposed in this step of the present application is determined by the depth of the later formed eDRAM holes. As will be described, the eDRAM hole depth ranges from about 0.5 µm to about 10 µm, and within that range from about 3 µm to about 6 µm. In one embodiment of the present application, the diameter of each first hole 14, i.e., first diameter d1, as measured from one exposed surface of the semiconductor substrate 10 to a neighboring surface of the semiconductor substrate 10 may range from about 30 nm to about 300 nm, and particularly, from about 50 nm to about 100 nm in diameter.

As stated above, the plurality of first holes 14 can be defined by a standard lithographic patterning processes. In one embodiment, the patterning process may include lithography and etching. In another embodiment, the patterning process includes a sidewall image transfer (SIT) process.

Figure 3:
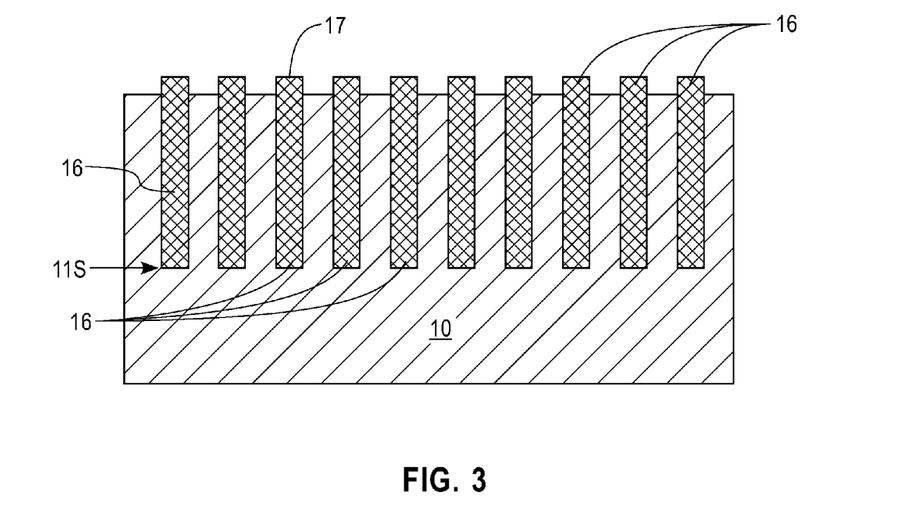
FIG. 3 is a cross sectional view of the exemplary semiconductor structure of FIG. 2 after providing a plurality of sacrificial hole isolation structures by filling each first hole of the plurality of first holes with a trench dielectric material.

Referring now to FIG. 3, there is illustrated the exemplary semiconductor structure of FIG. 2 after providing a plurality of sacrificial trench (i.e., hole) isolation structures 16 by filling each first hole of the plurality of first holes 14 with a dielectric material, and subsequent removal of each hard mask portion. The dielectric material that fills each first hole of the plurality of first holes 14 and provides each sacrificial hole isolation structure 16 comprises a different dielectric material than the dielectric material forming an uppermost portion of the hard mask layer 12L. In one example, and when the topmost surface of the hard mask layer 12L comprises silicon dioxide, then the hole dielectric material may comprise silicon nitride. In another example, and when the topmost surface of the hard mask layer 12L comprises silicon nitride, then the hole dielectric material may comprise silicon dioxide.

The filling of the hole dielectric material may comprise a deposition process, followed by a planarization process. Examples of deposition processes than can be used to provide the dielectric material within each first hole of the plurality of first holes 14 include chemical vapor deposition, plasma enhanced chemical vapor deposition, or physical vapor deposition. The dielectric material that is provided in each first hole of the plurality of first holes 14 typically overfills each first hole. Thus, a planarization process such as, for example, chemical mechanical planarization, can be used to provide sacrificial hole isolation structures 16 that are coplanar with the topmost surface of each hard mask portion 12P to result in each formed hole isolation structure 16 having an exposed top surface 17.

Each hard mask portion 12P is then removed utilizing an etching process that selectively removes the hard mask material that provides each hard mask portion 12P as compared to the hole dielectric material that provides each sacrificial hole isolation structure of the plurality of sacrificial hole isolation structures 16. After the removal of each hard mask portion 12P, a topmost surface of the semiconductor substrate 10, which is located between each sacrificial trench isolation structure of the plurality of sacrificial trench isolation structures 16, is exposed. As is shown in FIG. 3, the topmost surface of each sacrificial hole isolation structure of the plurality of sacrificial hole isolation structures 16 is laterally offset and located above the topmost surface of the semiconductor substrate 10 which is located between each sacrificial hole isolation structure of the plurality of sacrificial hole isolation structures 16.

Figure 4:
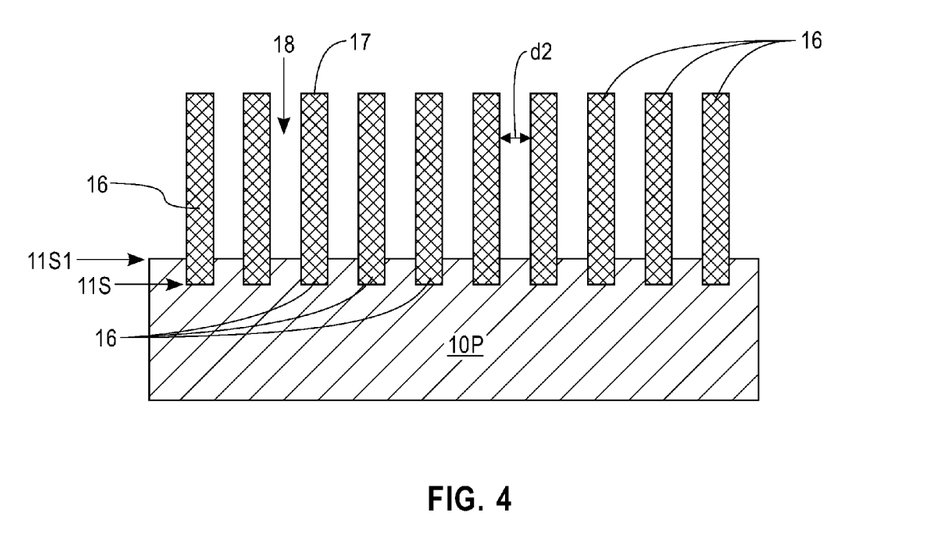
FIG. 4 is a cross sectional view of the exemplary semiconductor structure of FIG. 3 after forming a plurality of second trenches in the semiconductor substrate and adjacent each sacrificial hole isolation structure of the plurality of sacrificial hole isolation structures.

Referring now to FIG. 4, there is illustrated the exemplary semiconductor structure of FIG. 3 after forming a plurality of second trenches 18 in the semiconductor substrate 10 and adjacent each sacrificial hole isolation structure of the plurality of sacrificial hole isolation structures 16.

In one embodiment of the present application, each second trench of the plurality of second trenches 18 can be formed by recessing of the exposed portions of the semiconductor substrate 10 that is located adjacent each sacrificial hole isolation structure of the plurality of sacrificial hole isolation structures 16. In one example, the recessing of the exposed portions of the semiconductor substrate 10 can be performed utilizing an etching process that is selective in removing semiconductor material as compared to the hole dielectric material that provides each sacrificial hole isolation structure of the plurality of sacrificial hole isolation structures 16. In one embodiment of the present application, the etch employed to recess the exposed portion of the semiconductor substrate 10 can be performed utilizing an anisotropic etching process. In one example, the anisotropic etch may include reactive ion etching (RIE).

Each second trench of the plurality of second trenches 18 exposes another sub-surface 11S1 of the semiconductor substrate 10. The another sub-surface 11S1 of the semiconductor substrate 10 that is exposed is vertically offset and located above sub-surface 11S that was previously exposed when the plurality of first holes 14 were formed into the semiconductor substrate 10. Thus, and as shown in FIG. 4, the another sub-surface 11S1 is located above a bottommost surface of each sacrificial trench isolation structure of the plurality of sacrificial hole isolation structures 16. As such, a lower portion of each sacrificial hole isolation structure of the plurality of sacrificial hole isolation structure 16 is embedded with a remaining portion of the semiconductor substrate 10. The remaining portion of the semiconductor substrate 10 may be referred to herein as a semiconductor substrate portion 10P. In one embodiment of the present application, the width, i.e., second width or distance d2, of each second trenches 18, as measured from one exposed side surface of a sacrificial hole isolation structure 16 to a neighboring side surface of a sacrificial hole isolation structure 16 is greater than the first diameter. In one embodiment of the present application, the second distance is from 10 nm to 1 micrometer.

Figure 5:
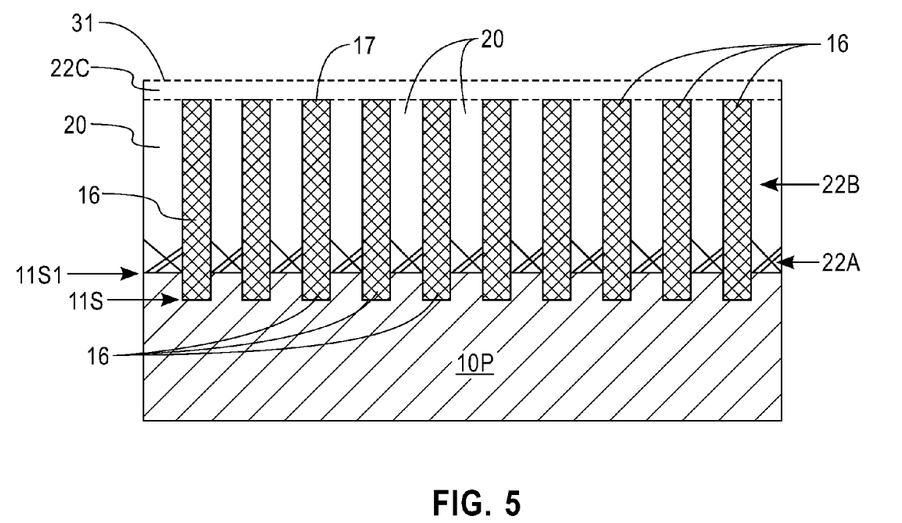
FIG. 5 is a cross sectional view of the exemplary semiconductor structure of FIG. 4 after epitaxially growing a layer of a second semiconductor material in each of the plurality of second trenches that extends beyond the top surface of each formed sacrificial hole isolation structures resulting in a formed top ART epitaxy defect free layer.

Referring now to FIG. 5, there is illustrated an exemplary semiconductor structure of FIG. 4 after epitaxially growing a layer 22B of a second semiconductor material in each of the plurality of second trenches 18 that extends beyond the top surface 17 of each formed sacrificial hole isolation structures 16 resulting in a formed top layer epitaxy structure 22C. The second semiconductor material preferably has a second lattice constant that is greater than the first lattice constant in each second trench of the plurality of second trenches 18. As explained in greater detail below, the epitaxial grown layer 22B forms aspect trapping regions 22A between the neighboring (i.e., adjacent) hole isolations isolation structures 16 and atop the substrate 10P interface 11S1 therebetween. This epitaxy growth process produces aspect ratio trapping above upper layer 11S1 resulting in the formation of semiconductor-containing pillar structures 20 surrounding each hole isolation structure 16 that extend beyond the surface 17 and surround the hole isolation structures to form a top defect free ART epitaxy semiconductor-containing layer 22C. In one example of the present application and when the semiconductor substrate 10P comprises silicon, then the second semiconductor material that provides each semiconductor-containing pillar structures 20 may comprise germanium. In another example of the present application and when the semiconductor substrate 10P comprises silicon, then the second semiconductor material that provides each semiconductor-containing pillar structure 20 may comprise an III-V compound semiconductor material such as, for example, InGaAs, InP, InAs and GaAs. In yet a further example of the present application and when the semiconductor substrate 10 comprises silicon, then the second semiconductor material that provides each semiconductor-containing pillar structure 20 may comprise an II-VI compound semiconductor.

Since the semiconductor-containing pillar structures 20 are formed within the second trenches 18, each semiconductor-containing pillar structure of the plurality of semiconductor-containing pillar structures 20 has width that is equal to the width, i.e., d2, of the second trenches 18. The second semiconductor material that provides each semiconductor-containing pillar structure 20 has a bottommost surface that directly contacts the another sub-surface 11S1 of the semiconductor substrate portion 10P, and a topmost surface that extends beyond a topmost surface 17 of each sacrificial hole isolation structure of the plurality of sacrificial hole isolation structures 16. As is shown, a sidewall surface of each semiconductor-containing pillar structure of the plurality of semiconductor-containing pillar structures 20 directly contacts an outer surface of neighboring sacrificial hole isolation structures 16.

The second semiconductor material that provides each semiconductor-containing pillar structure 20 includes a lower portion 22A (indicated by "χ" in the drawings) having a first defect density and a first upper portion 22B (not including the "χ") having a second defect density that is less than the first defect density, and the top layer portion 22C including a top surface 31 that is defect free. Top layer defect free ART epitaxy layer portion 22C may have a thickness ranging between 50 nm and 1000 nm.

The second semiconductor material that provides each semiconductor-containing pillar structure 20 can be formed utilizing an epitaxial semiconductor regrowth process such as is described, for example, in U.S. Patent Application Publication No. 2011/0049568 to Lochtefeld et al., the entire content and disclosure of which is incorporated herein by reference. This epitaxial semiconductor regrowth may be referred to herein as an aspect ratio trapping process. In the present application, the aspect ratio trapping process typically works better when the aspect ratio (trench depth to trench width) of the trench is at least 1:2. Notably, and since an epitaxial semiconductor regrowth process is used in forming the second semiconductor material that provides each semiconductor-containing pillar structure 20, each semiconductor-containing pillar structure 20 has a same crystalline characteristic as the semiconductor material of the another sub-surface 11S1 of the semiconductor substrate portion 10P.

In some embodiments of the present application, the selected crystallographic direction of the second semiconductor material that provides each semiconductor-containing pillar structure 20 is aligned with at least one propagation direction of threading dislocations in the opening in which each semiconductor-containing pillar structure 20 is formed. Threading dislocations in this region may substantially terminate at the side of the neighboring sacrificial hole isolation structures 16. In one embodiment of the present application, the selected crystallographic direction of the another sub-surface 11S1 of the semiconductor substrate portion 10P is aligned with direction of propagation of threading dislocations in the second semiconductor material that provides each semiconductor-containing pillar structure 20. In certain embodiments, the orientation angle ranges from about 30 to about 60 degrees, for example, is about 45 degrees to such crystallographic direction. The surface of the another sub-surface 11S1 of the semiconductor substrate portion 10P may have a (100), (110), or (111) crystallographic orientation. In some embodiments, the selected crystallographic direction is substantially aligned with a <110> crystallographic direction of the another sub-surface 11S1 of the semiconductor substrate portion 10P.

The second semiconductor material that provides each semiconductor-containing pillar structure 20 can be formed by selective epitaxial growth in any suitable epitaxial deposition system, including, but not limited to, atmospheric-pressure CVD (APCVD), low-(or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. The type of precursor gas is dependent on the type of second semiconductor material that is used in providing each semiconductor-containing pillar structure 20. Such precursor gases are well known to those skilled in the art and thus a detailed description of the same is not provided in this application. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

Figure 6:
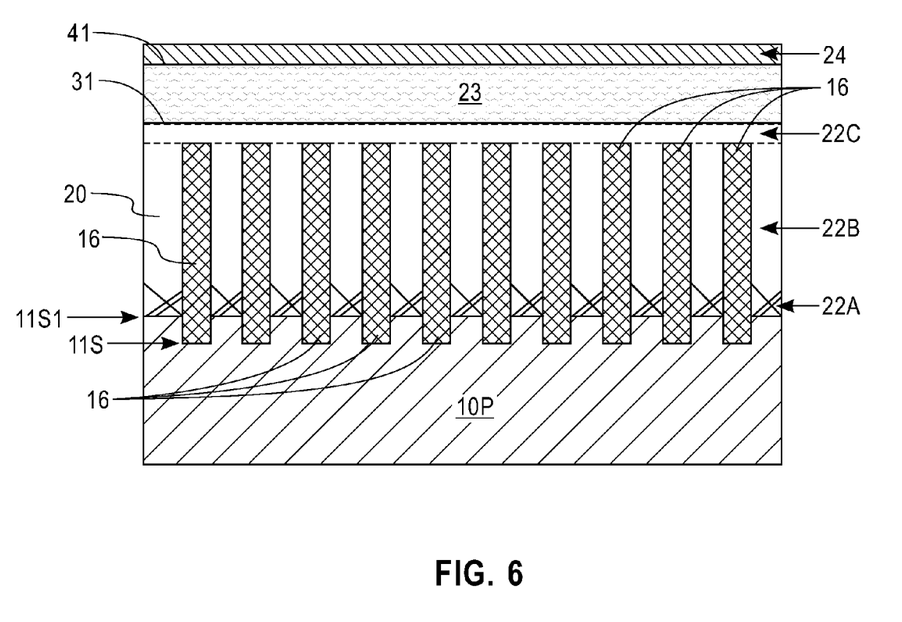
FIG. 6 is a cross sectional view of the exemplary semiconductor structure of FIG. 5 after epitaxially growing a further layer of a semi-insulating semiconductor material on a top surface of the ART epitaxy defect free layer.

Referring now to FIG. 6, there is illustrated the exemplary semiconductor structure of FIG. 5 after epitaxially growing a further blanket layer 23 of a semi-insulating (i.e., not semiconducting) semiconductor material on a top surface 31 of the ART epitaxy defect free layer 22C. The semi-insulating semiconductor layer 23 may be of a III-V compound semiconducting material such as InGaAs, InP, InAs and GaAs having a lattice constant that is substantially the same as or very close to the lattice constant of the underlying defect free ART semiconductor-containing material of layer 22C. The III-V compound semi-insulating semiconductor material preferably features a very high resistivity, i.e., and may be ion doped or, undoped with very low intrinsic carrier concentration, e.g., on the order of $10^{-6}$ cm$^{-3}$ or less. In other embodiments, a semi-insulating material may be used having a relatively wide energy band gap than the underlying layer 22C and that exhibits semi-insulating characteristics (e.g., InAlAs). The semi-insulating III-V semiconductor material layer 23 may be formed by an epitaxial growth process such as described herein in the forming of the ART epitaxy 22A-22C. In one embodiment, the thickness of the III-V compound semiconductor material layer 23 is designed to prevent current leakage of transistor devices formed above, e.g., greater than 50 nm.

As further shown in FIG. 6, above a top surface 41 of the semi-insulating III-V compound semiconductor material layer 23 is formed a device layer 24 comprising a III-V compound semiconductor material such as, for example, InGaAs, InAs, GaAs, and InP. In subsequent processing steps, the device layer 24 is used to form the channels of III-V compound semiconductor material transistor devices, e.g., planar CMOS Field Effect Transistors (FETs) or non-planar FINFET devices to be formed on top of the semi-insulating III-V semiconductor material layer 23.

In an example embodiment of the structure shown in FIG. 6, the ART layer 22B may comprise a group III-V semiconducting material, e.g., InP, and the semi-insulating layer 23 may be semi-insulating InP, such as iron doped InP. For example, iron doped InP material may be grown as layer 23 having an iron ion concentration ranging from about 1e15 to 1e17. The device layer 24, may be InGaAs (53 percent In) which has a same lattice constant as the underlying InP. In one embodiment, the lattice constants are the same for each of the ART layers 22B, 23 and 24.

In an example embodiment of the structure shown in FIG. 6, the ART layer 22B may comprise a group III-V semiconducting material, e.g., InP, and the semi-insulating layer may be semi-insulating InAlAs semiconducting material, and the device layer 24 may be InGaAs semiconducting material.

Figure 7:
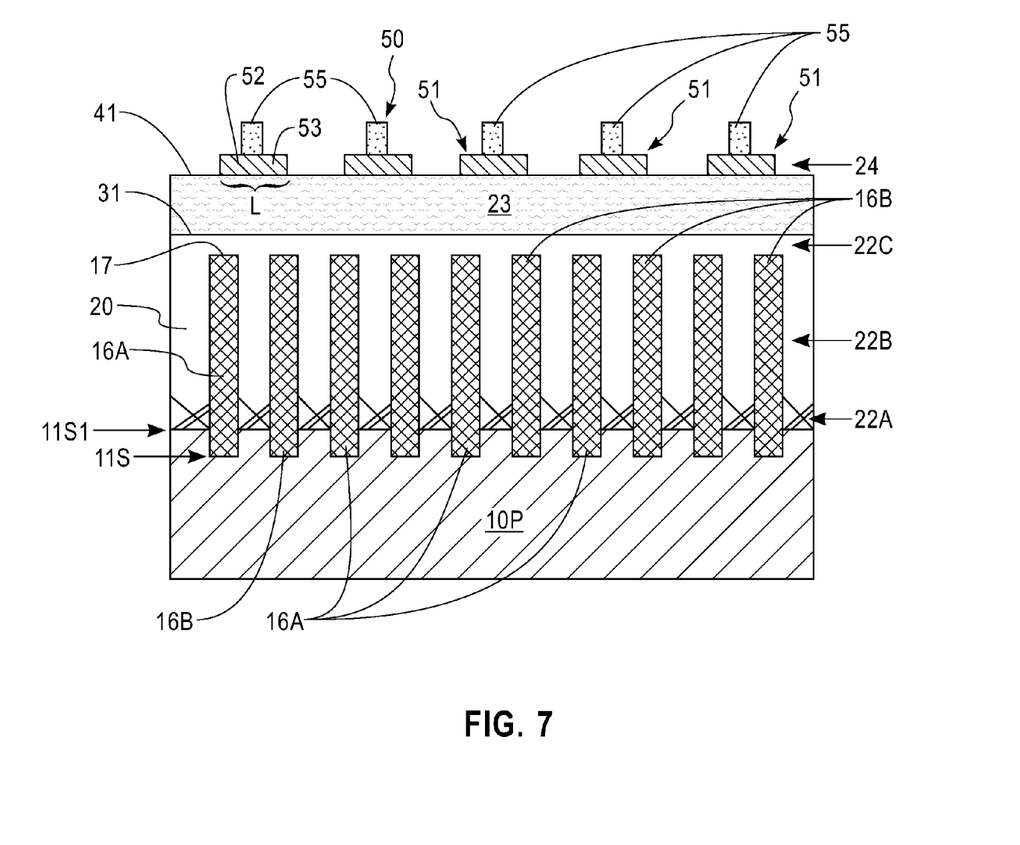
FIG. 7 is a cross sectional view of the exemplary semiconductor structure of FIG. 6 after forming a plurality of III-V compound semiconductor transistor devices, e.g., planar transistor devices.

Referring now to FIG. 7, there is illustrated the exemplary semiconductor structure of FIG. 6 after forming a plurality of III-V compound semiconductor transistor devices, e.g., planar transistor devices 50, as shown. Although not shown, semiconductor lithographic processes known in the art, e.g., mask pattern formation and wet or dry chemical etching, are used to form a plurality of III-V compound semiconductor channel structures 51 from layer 24. Further, lithographic gate-first or gate-last processing techniques may be performed, wherein in a gate first processing technique, a patterned mask is formed and material deposited to form a gate structure or gate stack structure 55, e.g., comprising an oxide or nitride based gate dielectric layer, and form a gate conductor, atop each channel structure 50. Further, for example, in the gate-first technique, lithographic mask formation and dopant material deposition processes may then be used to form respective source region 52 and drain region 53 at respective sides of each formed gate structure 55 to form a complete III-V compound material transistor device as known in the art.

In one embodiment, in the lithographic processes used in forming planar or 3D transistor (e.g., non-planar FinFET) devices 50, masks and etching processes are controlled to ensure that a formed respective drain or source region 52, 53 of a respective transistor device 50 is aligned with an underlying respective adjacent hole isolation structures, e.g., structures 16A, 16B.

Figure 8:
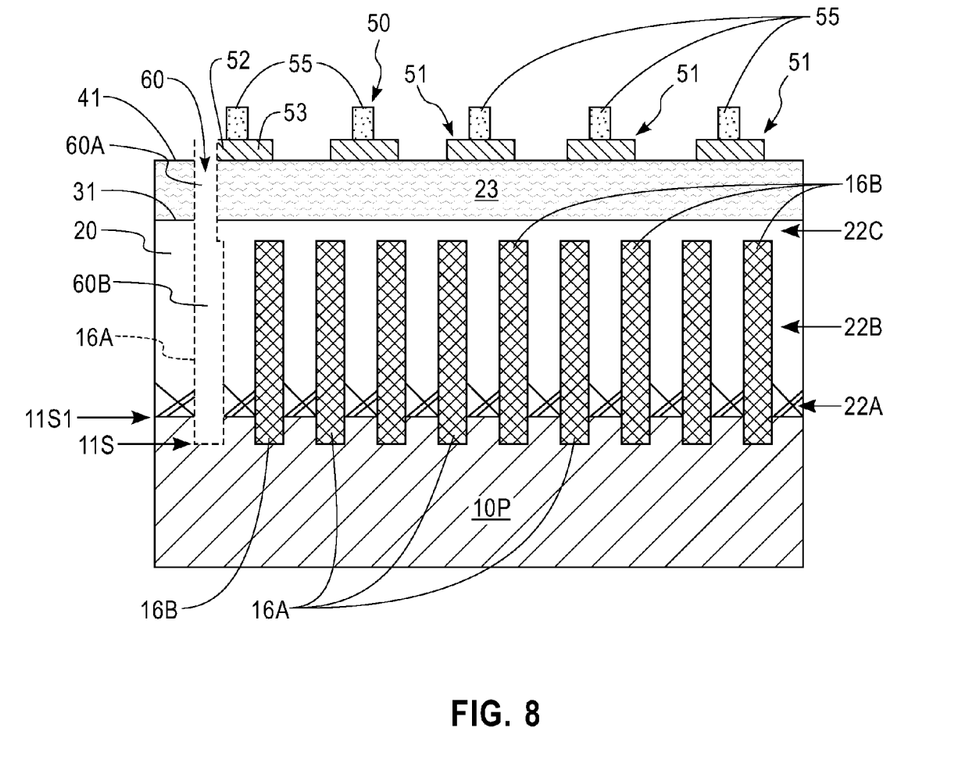
FIG. 8 is a cross sectional view of the exemplary semiconductor structure of FIG. 7 after performing lithographic processes steps to form an eDRAM hole comprising contiguous hole portions 60A and 60B at each respective transistor device.

Referring now to FIG. 8, there is illustrated the exemplary semiconductor structure of FIG. 7 after performing lithographic processes steps to form an eDRAM hole 60 comprising contiguous hole portions 60A and 60B at each respective transistor device 50. Lithographic masking and material recessing process steps are first applied to form a first hole portion 60A extending downward through from the source region 52 through the channel 51, and the hole 60A extending further down through the semi-insulating layer 23 to expose the top surface 17 of a corresponding hole isolation structure, e.g., 16A, underlying a respective device 50. This forming of hole 60A may include steps of lithographic patterning a hole at the channel region 51 and recessing using a wet chemical etch process, e.g., such as HF, selective to the sacrificial insulating material forming the hole isolation structure. A diameter of hole portion 60A is wide enough to be able to remove sacrificial material from the isolation hole structure, and deposit materials for forming the eDRAM structure within hole portions 60A, 60B. Thus, through the hole 60A exposing the top surface 17 of the hole isolation structure, a further anisotropic etching process step(s) is performed to remove the dielectric material within the hole isolation structure to form eDRAM hole portion 60B.

It is understood that, alternatively, the mask/recess and anisotropic etch steps may be used to form an eDRAM hole at the adjacent hole isolation structure 16B underlying the other doped region, e.g., drain region 53, of respective transistor devices 50. Moreover, it is understood that the process steps described in forming eDRAM hole are performed simultaneously at each corresponding transistor device of an array of eDRAM devices to be formed wherein the aspect ratio circular holes 16A or 16B are advantageously used as the EDRAM trenches/holes.

Figure 9:
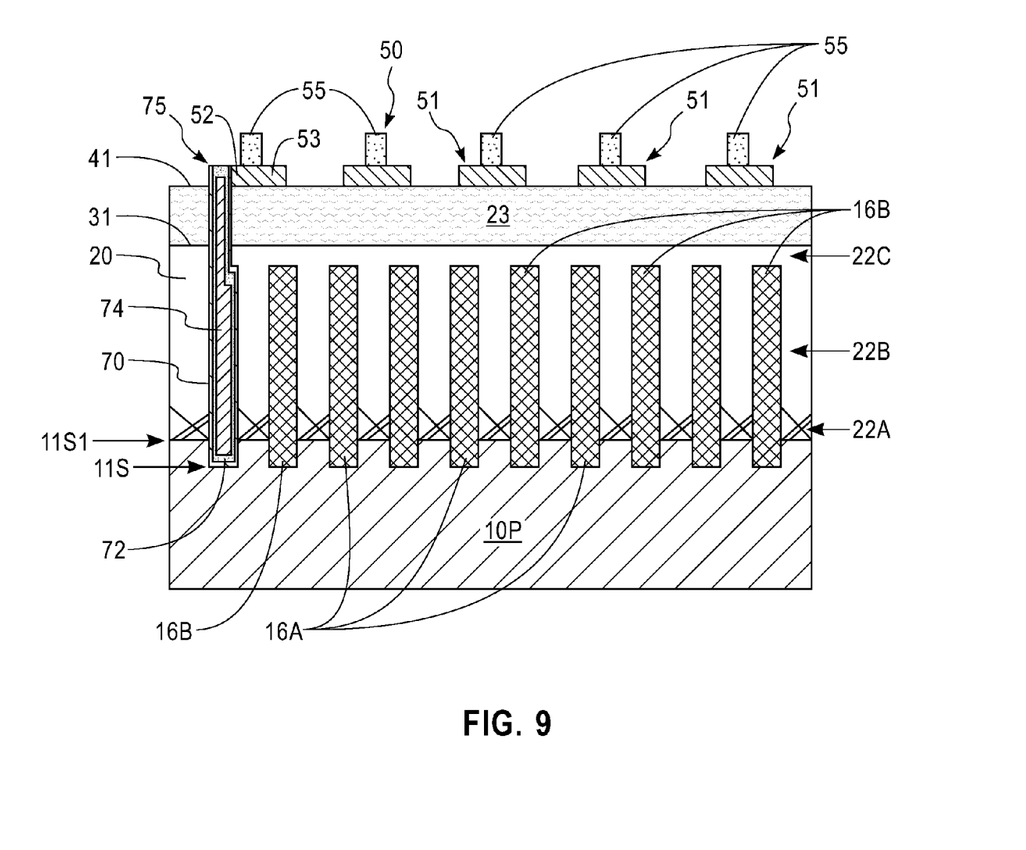
FIG. 9 is a cross sectional view of the exemplary semiconductor structure of FIG. 8 after performing lithographic processes steps to form an eDRAM structure within the formed contiguous hole portions.

Referring now to FIG. 9, there is illustrated the exemplary semiconductor structure of FIG. 8 after performing lithographic processes steps to form an eDRAM cell structure 75 within the formed contiguous hole portions 60A, 60B. In one embodiment, the eDRAM cell 75 may be fabricated by, but not limited to, known lithographic techniques (e.g., pattern, etching and deposition) for forming a deep trench capacitor. Such techniques for forming the eDRAM cell within the formed contiguous hole portions 60A, 60B may include: the forming of a first outer conductive electrode 70, a node dielectric 72, and an inner conductive material fill electrode 74. The outer conductive electrode 70 and the inner electrode 74 may serve as the two electrical conductors and the node dielectric 72 serves as the insulator between the two conductors. For example, a first conductive material, e.g., a metal, may be deposited using techniques known in the art to form the first outer conductive electrode 70 along the inner circular wall surfaces of the hole portions 60A and 60B. Then, a dielectric material 72 is deposited along the formed first outer conductive electrode 70 within the formed hole portions 60A and 60B. EDRAM dielectric material may include ON (oxynitride) or another dielectric material such as $Si_3N_4$, $SiO_2$, $Al_2O_3$, $ZrO_2$, and $HfO_2$ and deposited using deposition methods, such as CVD or plasma-enhanced CVD. The node dielectric layer 72 may have a thickness ranging from about 1 nm to about 7 nm or a thickness ranging from about 1.5 nm to about 3 nm. Then, a further conductive material 74, e.g., a metal, a polysilicon, or doped polysilicon, may fill the remaining hole portions 60A, 60B to form the inner electrode 74 of the eDRAM structure 75 for the respective transistor device. The inner electrode fill material may be deposited using deposition techniques such as: chemical vapor deposition (CVD), low pressure CVD (LPCVD), and high-density chemical vapor deposition (HD-CVD).

Although not shown, further processing steps (not shown) may be used to ensure proper electrical connections of the outer electrode conductor 70 and inner electrode conductor 74 to either the source region or drain region of a corresponding transistor device 50, a corresponding conductive bitline, or other circuitry (not shown). It is understood that the eDRAM structures 75 corresponding to each transistor device 50 of the array are formed simultaneously.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor substrate comprising a first semiconductor material having a first lattice constant;
   a first layer of second semiconductor material formed on said substrate, said first layer having a second lattice constant that is greater than the first lattice constant;
   a second layer of a semi-insulating, third semiconductor material atop a top surface of the first layer;
   a transistor device formed on top of the second layer; and
   an eDRAM structure electronically connected with a channel region of the transistor device, the eDRAM structure extending from the channel region of the transistor device to a sub-surface below a top surface of the semiconductor substrate.

2. The semiconductor structure of claim 1, wherein the second semiconductor material and the third semiconductor material comprise a same semiconductor material.

3. The semiconductor structure of claim 1, wherein the second semiconductor material comprises a different semiconductor material from the third semiconductor material.

4. The semiconductor structure of claim 1, wherein the second semiconductor material comprises a lower portion having a first defect density and an upper portion having a second defect density that is less than the first defect density.

5. The semiconductor structure of claim 1, wherein the second semiconducting material and the third semi-insulating semiconductor material comprise a group III-V compound semiconductor material.

6. The semiconductor structure of claim 1, wherein the eDRAM structure is formed within a hole structure having a diameter ranging between about 30 nm to about 300 nm.

7. The semiconductor structure of claim 1, wherein the eDRAM structure is formed within a hole structure having a depth ranging between about 0.5 μm to about 10 μm.

8. The semiconductor structure of claim 1, wherein the transistor device is a planar FET transistor device.

9. The semiconductor structure of claim 1, wherein the transistor device is a non-planar transistor device.

10. The semiconductor structure of claim 1, wherein the third semiconductor material and second semiconductor material have lattice constants that are substantially the same.

11. The semiconductor structure of claim 1, wherein a device layer comprising a III-V compound semiconductor material is located directly upon a topmost surface of the second layer.

* * * * *